(12) United States Patent
Breitwisch et al.

(10) Patent No.: US 6,700,163 B2
(45) Date of Patent: Mar. 2, 2004

(54) SELECTIVE SILICIDE BLOCKING

(75) Inventors: Matthew J. Breitwisch, Essex Junction, VT (US); Jeffrey S. Brown, Middlesex, VT (US); Terence B. Hook, Jericho, VT (US); Randy W. Mann, Jericho, VT (US); Christopher S. Putnam, Hinesburg, VT (US); Mohammad I. Younus, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 68 days.

(21) Appl. No.: 09/683,278

(22) Filed: Dec. 7, 2001

(65) Prior Publication Data

US 2003/0107091 A1 Jun. 12, 2003

(51) Int. Cl.⁷ .................. H01L 29/76; H01L 29/94; H01L 31/062; H01L 31/113; H01L 31/119
(52) U.S. Cl. .................. 257/369; 257/350; 257/412
(58) Field of Search ................ 257/369, 350, 257/412

(56) References Cited

U.S. PATENT DOCUMENTS

| | | | |
|---|---|---|---|
| 4,656,731 A | 4/1987 | Lam et al. | |
| 5,633,523 A * | 5/1997 | Kato | 257/369 |
| 5,635,426 A * | 6/1997 | Hayashi et al. | 438/453 |
| 5,973,382 A | 10/1999 | Burgener et al. | |
| 6,020,242 A | 2/2000 | Tsai et al. | |
| 6,051,864 A | 4/2000 | Hodges et al. | |
| 6,057,215 A | 5/2000 | Kitano | |
| 6,160,282 A | 12/2000 | Merrill | |
| 6,194,258 B1 | 2/2001 | Wuu | |
| 6,521,528 B1 * | 2/2003 | Asamura | 438/655 |
| 6,521,952 B1 * | 2/2003 | Ker et al. | 257/360 |

OTHER PUBLICATIONS

R.D. Isaac, "The Future of CMOS Technology", May 3, 2000, vol. 44, pp. 369–378

* cited by examiner

Primary Examiner—Phat X. Cao
(74) Attorney, Agent, or Firm—Schmeiser, Olsen & Watts; William D. Sabo (57) ABSTRACT

A selectively silicided semiconductor structure and a method for fabricating same is disclosed herein. The semiconductor structure has suicide present on the polysilicon line between the N+ diffusion or N+ active area and the P+ diffusion or active area at the N+/P+ junction of the polysilicon line, and silicide is not present on the N+ active area and the P+ active area. The presence of this selective silicidation creates a beneficial low-resistance connection between the N+ region of the polysilicon line and the P+ region of the polysilicon line. The absence of silicidation on the N+ and P+ active areas, specifically on the PFET and NFET structures, prevents current leakage associated with the silicidation of devices.

16 Claims, 6 Drawing Sheets

SELECTIVE SILICIDE BLOCKING

BACKGROUND OF THE INVENTION

This invention relates to the fabrication of an integrated circuit structure in which silicidation is selectively performed within individual integrated circuit structures to reduce current leakage.

Today, our society is heavily dependent on high-tech electronic devices for everyday activity. Integrated circuits are the components that give life to our electronic devices. Integrated circuits, including memory components and logic components, are found in widespread use throughout the world, in appliances, in televisions and personal computers, and even in automobiles. Additionally, modern manufacturing and production facilities are becoming increasingly dependent on the use of machines controlled by integrated circuits for operational and production efficiencies. Indeed, in many ways, our everyday life could not function as it does without integrated circuits. These integrated circuits are manufactured in huge quantities in our country and abroad. Improved integrated circuit manufacturing processes have led to drastic price reductions and performance enhancements for these devices. Examples of performance enhancements include faster processing speeds and reduced power usage.

The traditional integrated circuit memory cell fabrication process begins with a wafer of silicon and involves four basic operations: 1) layering, 2) patterning, 3) doping, and 4) heat treatment. Layering is the process of depositing materials which have different conductive characteristics such as insulators or conductors in layers on the silicon wafer until the devices are complete. These layers of material can be deposited in geometric patterns so that materials with different conductive characteristics are stacked on top of each other to create an operational integrated circuit in three dimensions. The patterning process used to fabricate integrated circuits is typically performed using lithography followed by a variety of subtractive (etch) and additive (deposition) processes. Doping can be used to create areas of P type (hole-mobile) silicon or N type (electron-mobile) silicon. Complementary metal-oxide-semiconductors (CMOS) are composed of complementary P type and N type Field Effect Transistors (PFETs and NFETS). Heat treatment can be used to activate dopants and repair damage in wafers (annealing) or to provide electrical connections between metal layers and silicon layers (alloying). These fabrication methods are well known in the art.

One process regularly used in the fabrication of semiconductor structures is silicidation. Silicidation is a process by which a conductive layer of metal-silicon alloy is formed in an integrated circuit structure. Usually, silicidation occurs by blanketing a layer of metal, most commonly titanium or cobalt, across an entire wafer surface and heat-treating the surface to form a conductive metal-silicon compound wherever silicon is exposed. Metal-silicon alloys such as titanium disilicide (TiSi2) or cobalt disilicide (CoSi2) can be formed at the areas of exposed silicon. Silicidation is desirable in semiconductor structures in many instances because the application of this conductive layer reduces the resistance in silicon active regions, especially in polysilicon lines. This reduction in resistance will reduce the amount of time that it takes for a signal to travel through the chip or the integrated circuit, will reduce the voltage at which a chip can operate, and will improve the chip's performance.

While silicidation may reduce resistance between elements, allowing the elements to operate more effectively, this same process of silicidation may also exacerbate current leakage. Current leakage increases power usage and reduces battery life. While competitive forces demand the improved performance associated with silicidation, those same competitive forces also demand reductions in power usage of integrated circuits. Reduced power usage leads to highly desirable longer battery life for devices such as portable computers, cellular telephones, and other portable devices.

Therefore, there exists a need to improve the performance of integrated circuits or chips while at the same time reducing power usage of the circuit.

BRIEF SUMMARY OF THE INVENTION

In a first aspect, the invention comprises a semiconductor structure comprising an N+ diffusion and a P+ diffusion formed in a semiconductor substrate; a polysilicon line formed on the substrate intersecting the N+ diffusion and the P+ diffusion; wherein the polysilicon line has a P+ region, an N+ region and an N+/P+ junction area therebetween; a silicide strap extending across the N+/P+ junction area of the polysilicon line wherein the suicide strap forms an electrical connection between the P+ region of the polysilicon line and the N+ region of the polysilicon line; and wherein the N+ diffusion or the P+ diffusion are not silicided.

In a second aspect, the invention comprises a method for forming a semiconductor apparatus comprising the steps of forming an N+ diffusion and a P+ diffusion; forming a polysilicon line, the polysilicon line having a P+ region and an N+ region, the polysilicon line having an N+/P+ junction area wherein said junction area comprises the area where the P+ region of the polysilicon line and the N+region of the polysilicon line abut each other; and, selectively forming a silicide strap extending across the junction area, wherein the silicide strap forms an electrical connection between the P+ region of the polysilicon line and the N+ region of the polysilicon line; and selectively preventing the formation of silicide on the N+ diffusion and the P+ diffusion.

In the invention, by selectively applying silicide at the N+/P+ junction, a low resistance connection can be made between the N+ and P+ regions of the polysilicon line, which increases the conductivity in this region. By selectively not applying silicide over the NFET and PFET regions, the current leakage that occurs as a result of blanket silicidation is minimized.

The foregoing and other features and advantages of the invention will be apparent from the following more particular description of preferred embodiments of the invention, as illustrated in the accompanying drawings.

BRIEF DESCRIPTION OF THE SEVERAL VIEWS OF THE DRAWINGS

The embodiments of the present invention will hereinafter be described in conjunction with the appended drawings, wherein like designations denote like elements.

DETAILED DESCRIPTION OF THE INVENTION

Best Mode For Carrying Out The Invention

This invention provides a device and method to selectively allow silicide to form on parts of an integrated circuit structure and block silicide from forming on other parts of an integrated circuit structure so that the benefits of silicidation, decreased resistance between elements, can be achieved while reducing unwanted byproducts of silicidation including current leakage between elements.

Semiconductor structures can be treated or doped with chemicals to make N type regions, electron conduction regions, or P type regions, hole conduction regions. The creation of these regions is an essential step in producing the complementary P type and N type field effect transistors (PFETs and NFETs) which are components of Complementary Metal Oxide Semiconductor (CMOS) devices. One such CMOS device is a Static Random Access Memory or SRAM device. While an SRAM cell is the embodiment that will be described here, those of ordinary skill in the art will recognize that the invention may be applied to any semiconductor structure where P type polysilicon abuts N type polysilicon.

Silicidation is a valuable and helpful process in the fabrication of semiconductor structures.

Silicidation decreases the resistance of silicon active regions, especially polysilicon lines. This reduction in resistance reduces the amount of time required for a signal to travel through the chip and also reduces the voltage at which a chip can operate. Also, silicidation creates an electrical short between N type and P type regions that would otherwise exhibit diodic behavior. Therefore, silicidation improves the performance of a semiconductor structure or chip.

Figure 1:
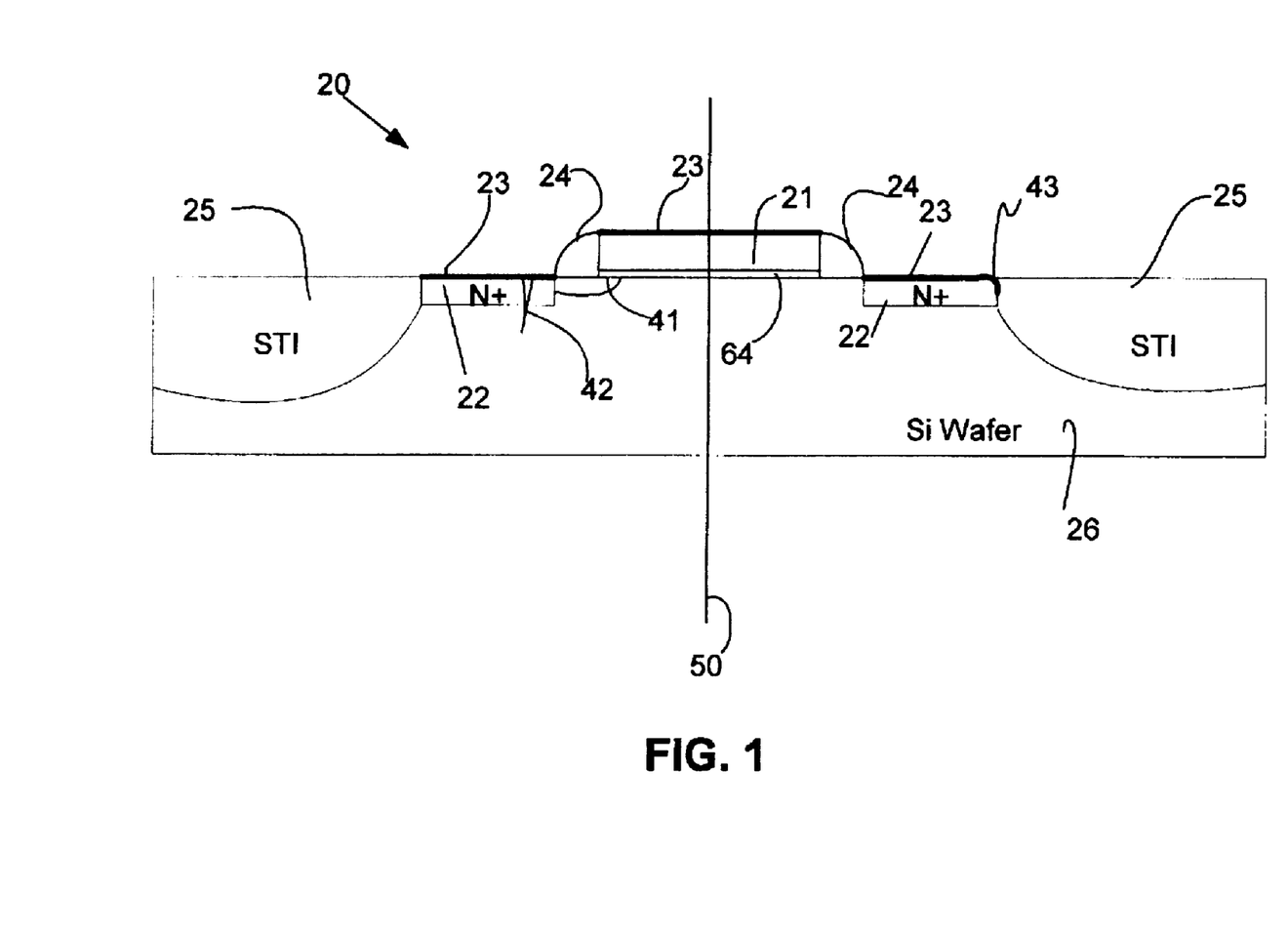
FIG. 1 is a cross-section through the gate area of a semiconductor transistor illustrating the types of leakage that can occur with silicidation.

Silicidation may also cause current leakage. This current leakage can be a significant portion of the chip standby leakage. Turning now to the figures, FIG. 1 illustrates several types of undesirable current leakage that may occur as a result of silicidation. FIG. 1. is a cross-section across the polysilicon gate 21 of a typical NFET 20. The NFET 20 of FIG. 1 is shown to illustrate a typical CMOS structure and is not intended to limit the scope of the invention. FIG. 1 illustrates a silicon wafer 26 that has been patterned to define an N+ diffusion, which includes source/drain regions 22 bounded by regions of shallow trench isolation (STI) 25. The source/drain 22 regions are spanned by a polysilicon gate 21. The polysilicon gate 21 can be a stacked gate or any other well-known gate architecture. The polysilicon gate 21 may have a layer of gate oxide 64. Spacers 24 may be present along the sides of the gate 21. Spacers 24 can be made from a combination of silicon oxide and/or silicon nitride which are both electrical insulators. These spacers 24 can be present to electrically isolate the gate from the source/drain regions.

In a typical blanket application of silicide, the exposed face of the semiconductor structure is coated with metal such as titanium or cobalt and heat treated so that, in those regions where silicon is exposed, a silicide layer 23 (for example titanium disilicide (TiSi2) or cobalt disilicide (CoSi2)) is formed. In the absence of exposed silicon, no silicide is formed, and unreacted metal can be selectively removed. As illustrated in FIG. 1, silicidation may enhance current leakage in an NFET structure 20 at several locations. While FIG. 1 illustrates several areas which may exhibit current leakage, FIG. 1 is not exhaustive of the types of current leakages which might occur.

Ideally, no silicide is formed on the surface of the spacers 24 because the spacers 24 are composed of silicon oxide and/or silicon nitride. Therefore, when the silicidation step is performed, no silicide will form because there is no exposed silicon present on the spacers to react with the siliciding metal. However, after the silicidation step, some small amount of residual conducting material may be left on the spacers, resulting in some small amount of leakage between the gate and the source or drain. This "over the spacer leakage" may be a source of current leakage in a typical device.

Gate-induced Drain Leakage (GIDL) 41 is a parasitic leakage inherent to all CMOS devices and becomes relevant for low leakage devices where GIDL and sub-threshold source to drain current becomes comparable. GIDL 41 is current that flows between the drain and the substrate and is caused by an increase in the electric field under the overlap region due to the proximity of the poly Si gate material.

In general, silicided N type FETs have higher GIDL values than non-silicided N type FETs. This may be due to several factors. First, during the process of silicidation, silicide may spike deep into the surface of the semiconductor structure. This spiking is referred to as a silicide defect 42. When silicide defects 42 occur over the source/drain active silicon regions, this silcide defect 42 may result in current leakage into the substrate (wafer) 26. Second, current leakage may also occur at the edge 43 of the shallow trench isolation (STI) 25 where it meets the silicon wafer 26. In theory, the surface of the silicon active area or source/drain area 22 and the surface of the adjacent STI 25 is perfectly flat. However, in practice, there may be a depression at this location or the STI 25 may be weak at this abutment. During the process of silicidation, silicide can pool in this depression, or cause "pull-down" as illustrated in FIG. 1. This effect may cause current leakage to the silicon substrate 26.

In addition, in theory, a perfectly even and uniform layer of metals can be applied to the surface of a semiconductor device to form a perfect uniform layer of silicide. In practice, it can be very difficult to form a perfectly uniform layer of silicide. Silicide may not form evenly in very small active areas of silicon and/or in small active areas of silicon between polysilicon lines called "canyons." This poor silicide formation may lead to leakage similar to those described above. In addition, this poor silicide formation may lead to other defects that cause the semiconductor to exhibit poor performance or cause circuits to fail.

Figure 2:
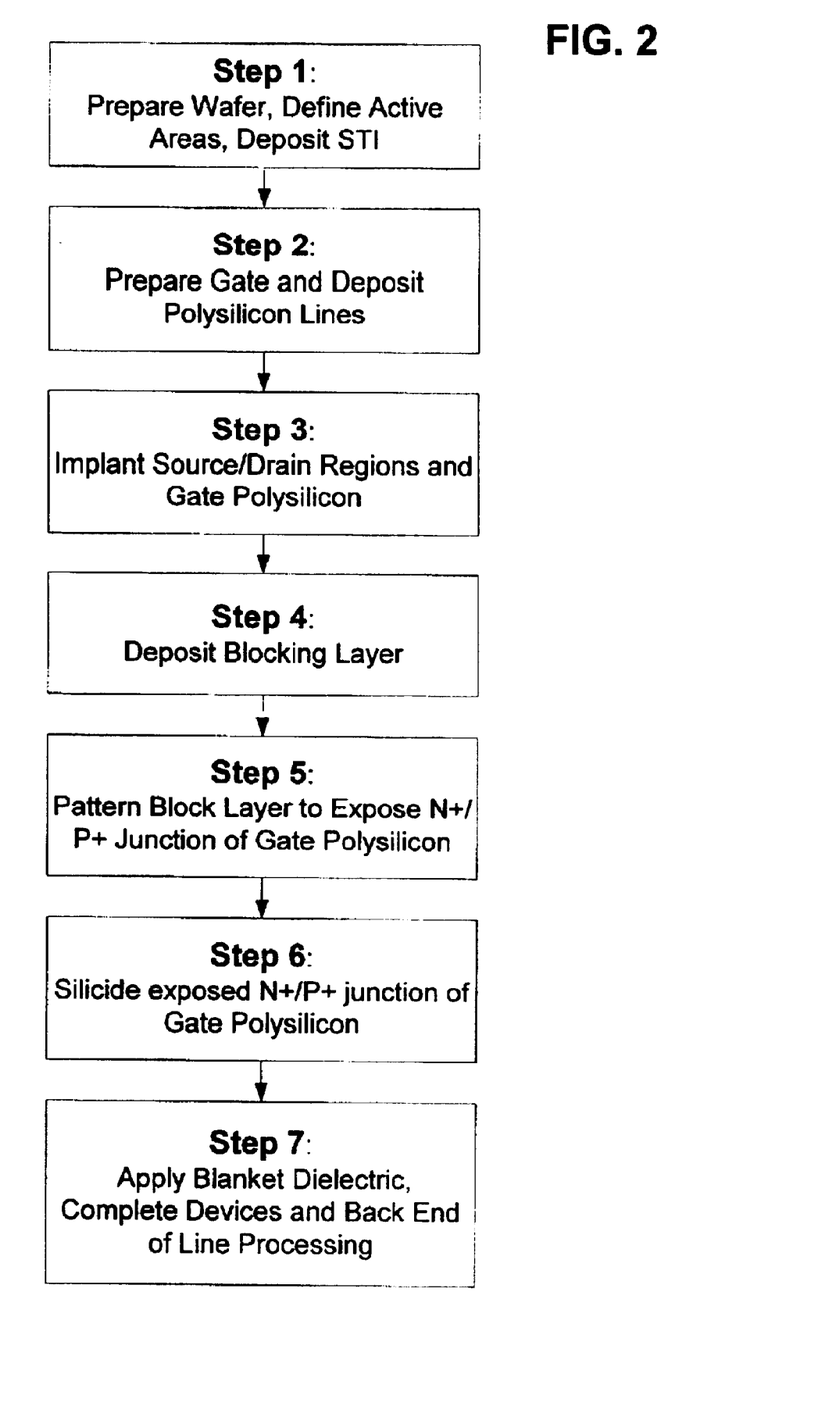
FIG. 2 is a flow chart illustrating an embodiment of steps in the fabrication of a semiconductor structure of the present invention.
Figure 3:
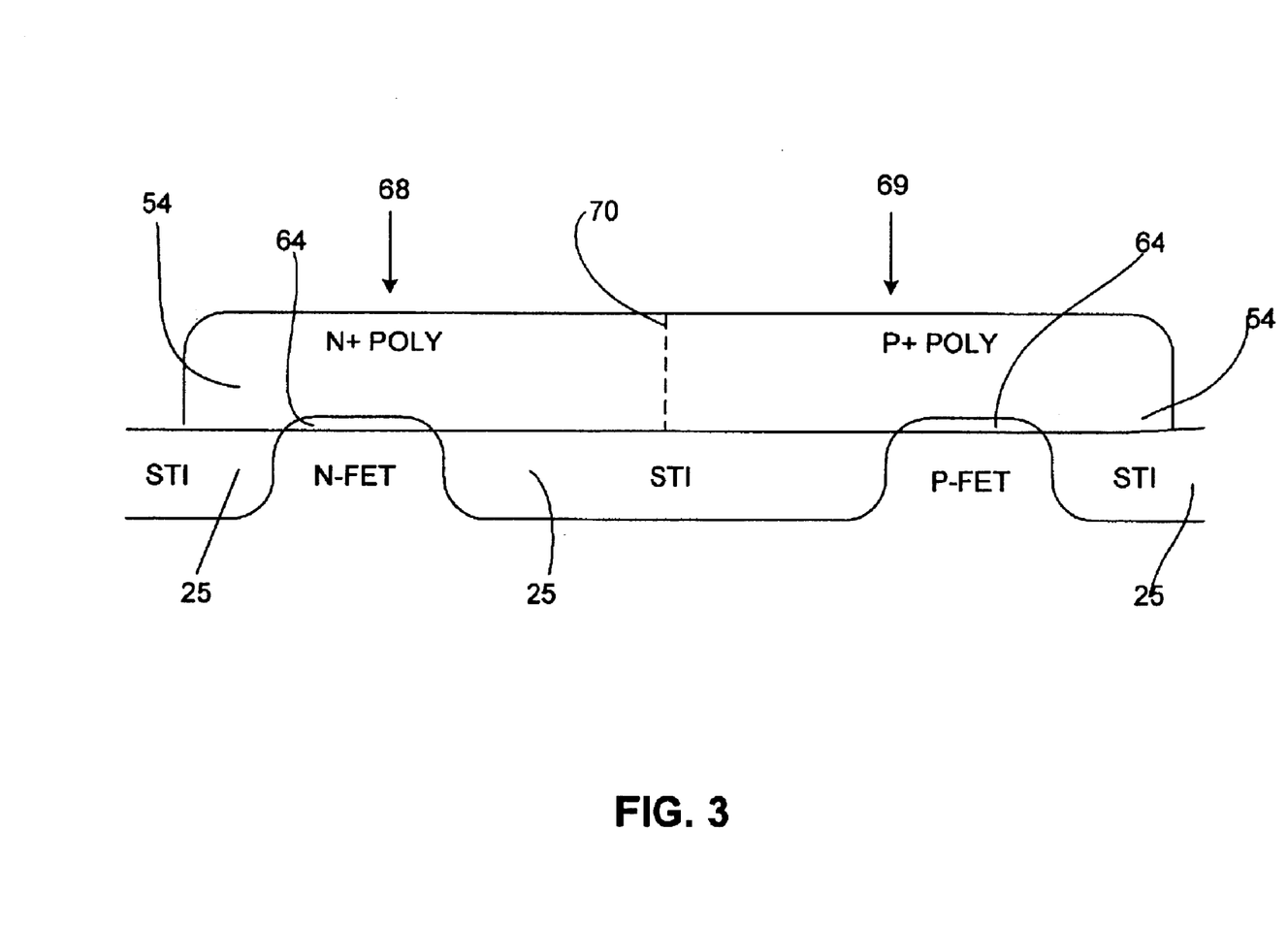
FIG. 3 is a cross-sectional view taken at line 50 of FIG. 1, of the region of selective silicidation, illustrating steps in the fabrication of the present invention.

FIG. 2 is a flow chart illustrating an embodiment of steps in the fabrication of a semiconductor structure which is selectively silicided to allow silicide to form on parts of an integrated circuit structure and block silicide from forming on other parts of an integrated circuit structure of the present invention. In Step 1, a semiconductor structure of the present invention is fabricated from a prepared silicon wafer 26. Active regions are defined and trenches are etched in the silicon around the active regions. Isolation material (STI) is deposited into the trenches to isolate active areas. In Step 2, gates are prepared by depositing gate oxide in the region of the gate and depositing gate polysilicon. Turning now to FIG. 3, a cross-sectional view at line 50 of FIG. 1, of an example of a semiconductor structure which might result from steps 1 and 2 of FIG. 2 is illustrated. FIG. 3 illustrates that this gate polysilicon can be in the form of a long polysilicon line 54.

Figure 4:
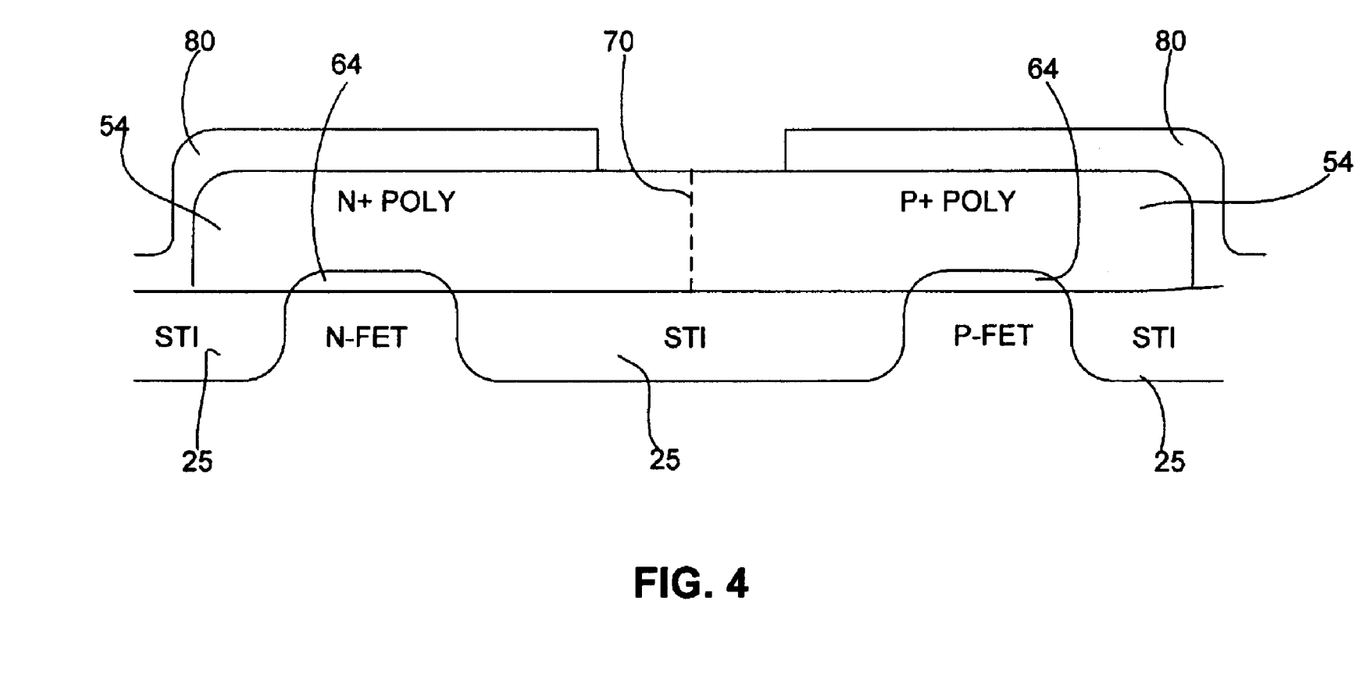
FIG. 4 is a cross-sectional view taken at line 50 of FIG. 1, of the region of selective silicidation, illustrating steps in the fabrication of the present invention.
Figure 5:
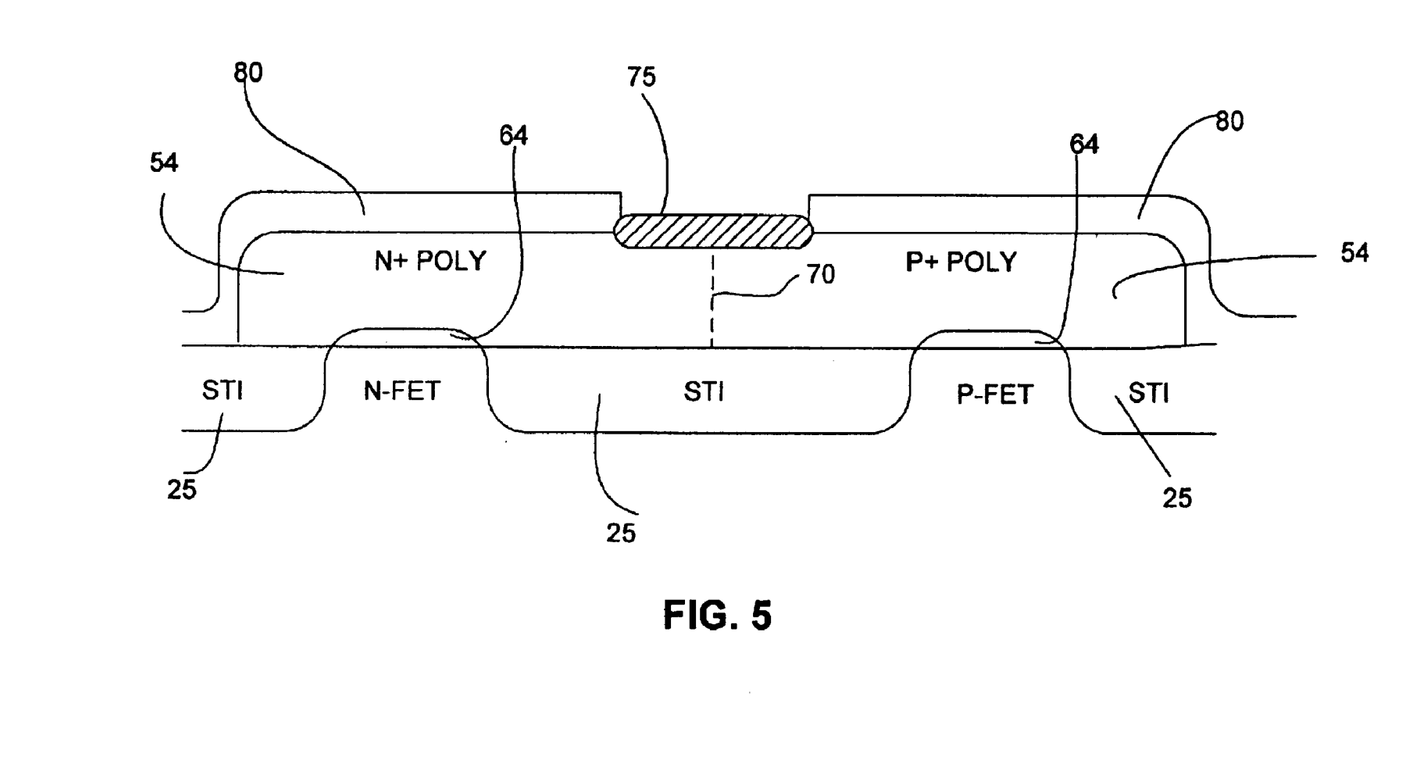
FIG. 5 is a cross-sectional view taken at line 50 of FIG. 1, of the region of selective silicidation, illustrating steps in the fabrication of the present invention; and, FIG. 6 is a top view of an SRAM cell illustrating the present invention.

Turning back to FIG. 2, in step 3, N+ and P+ active areas are implanted to form N+ diffusions (see 66 in FIG. 6) by implanting or doping the exposed silicon in these regions with an N type element such as Arsenic or other suitable element. Similarly, P+ diffusions are formed (see 67 in FIG. 6) by implanting or doping the exposed silicon in these regions with a P type element such as Boron or other suitable element. These N+ diffusions and P+ diffusions, when present in the appropriate architecture on either side of the polysilicon gate, form source/drain regions in NFETs and PFETs. During the implanting step, gate polysilicon, shown in FIG. 3 as long polysilicon lines 54, are also implanted. This creates a polysilicon line 54 with an N+ region 68 and a P+ region 69. At a location along the polysilicon line 54, the N+ region abuts the P+ region to form an N+/P+ junction 70. Examples of these structures are illustrated in FIGS. 3–5.

Figure 6:
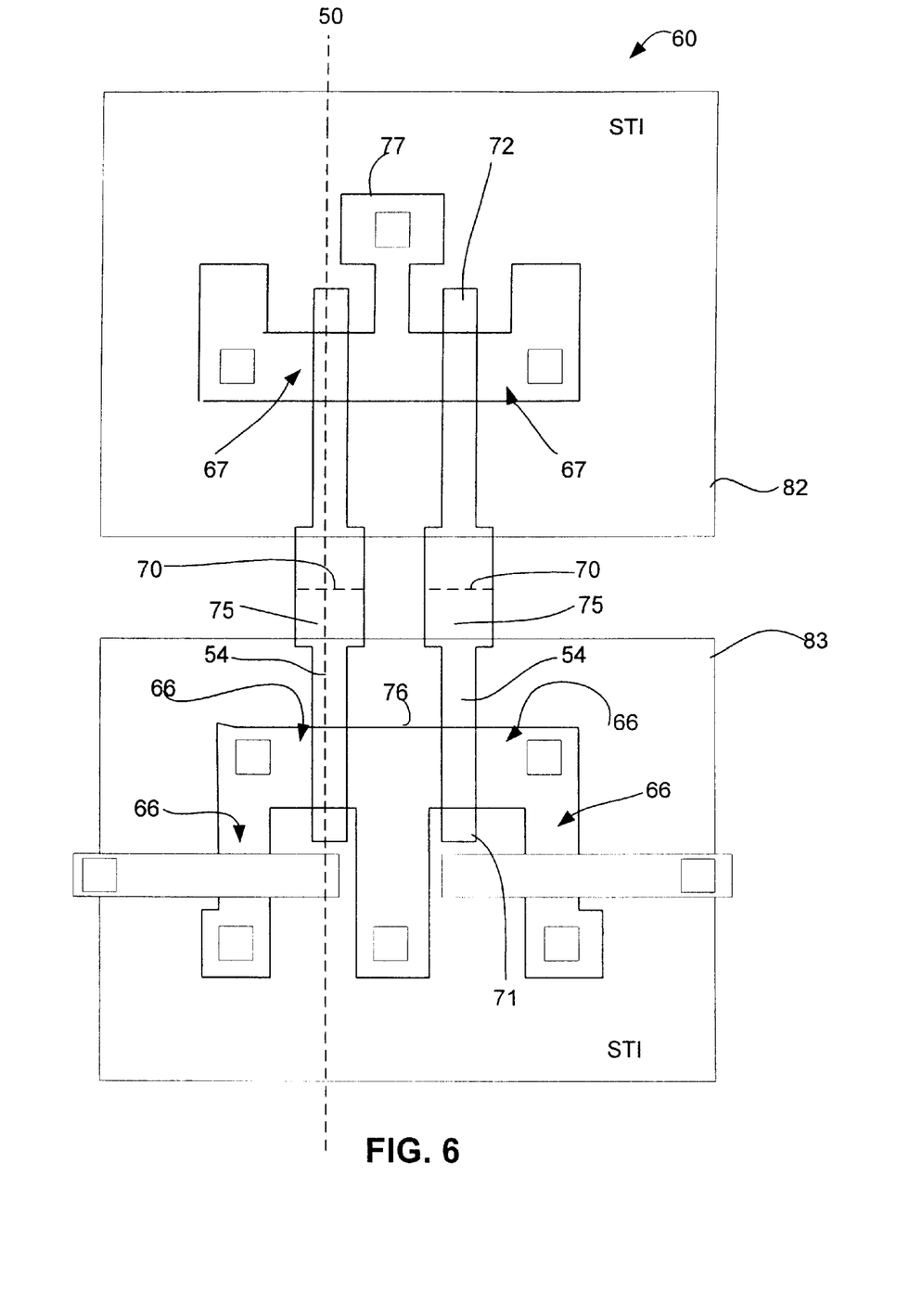

In Step 4, a blocking layer 80 is selectively applied to the active areas (the regions shown as 82 and 83 in FIG. 6). This blocking layer may be patterned or selectively applied to the active areas by using a mask to limit the application of the blocking layer to the active areas, or by applying a blanket layer of blocking material and selectively removing the blocking material from the application areas. the blocking material may be nitride or other suitable blocking material. An example of this blocking layer 80 is illustrated in FIG. 4.

In Step 5, a blocking layer can be applied to selectively expose the N+/P+ junction for silicidation. For example, a layer of blocking material such as nitride can be applied to the entire surface of the semiconductor structure. A layer of photoresist can be applied on top of the nitride hard mask material. The photoresist can be selectively exposed or patterned using a mask. The mask selectively exposes the photoresist to light. Therefore, some areas of photoresist are exposed to light and some areas are in shadow during the light exposure. The exposed photoresist is then developed. Depending on whether a negative or positive tone resist is used, the unexposed or exposed photoresist can then be washed away during rinsing steps. After this patterning step, the semiconductor structure has a layer of nitride or hard mask, covered with a selectively applied layer of photoresist. A "Reactive Ion Etch" (RIE) may be used to etch the areas not protected by photoresist. After the RIE step, the semiconductor structure may have a layer of nitride or hard mask, patterned to expose the polysilicon in the region of the N+/P+ junction. An example of this structure is illustrated in FIG. 4.

Alternatively, a layer of photoresist can be applied to the surface of the semiconductor structure. A mask can be used to selectively expose photoresist to form a pattern of photoresist on the area of the N+/P+ junction 70 of the polysilicon gate. A layer of nitride or other blocking material can be applied to the semiconductor structure, creating a semiconductor structure with nitride or other blocking material present on top of the active areas, and photoresist present on top of the N+/P+ junction 70 of the polysilicon gate. The photoresist can then be removed using techniques well-known in the industry. As a result of these steps, a layer of blocking material, or hard mask 80, resides over the active areas of the semiconductor structure and the silicon of the N+/P+ junction region of the polysilicon gate is exposed.

As will be recognized by those of ordinary skill in the art, many alternative methods can be used to fabricate the structure as shown in FIG. 5. While we have described two such methodologies, these methods are not exhaustive of the methods that can be used to fabricate such a structure.

In Step 6, metal such as cobalt or titanium or other suitable metal is applied to the surface of the semiconductor structure and the semiconductor structure is heat-treated to form metal silicide in the area of exposed silicon. In the areas covered with the blocking layer, no silicide is formed. This silicide structure is a silicide strap 75. An example of this structure is illustrated in FIG. 5.

In Step 7, the semiconductor structure is finished. These finishing steps will depend on the requirements of the device and may include applying a blanket dielectric such as nitride, completing devices, creating contacts and metal wiring and other back end of line processing. The nature of the finishing steps is dependent upon the nature of the semiconductor device that is being fabricated.

FIGS. 3–5 are cross-sectional views taken at line 50 of FIG. 1 (see also line 50 of FIG. 6, also indicating the cross-sectional view represented by FIGS. 3–5), of the region of selective silicidation, the silicide strap, illustrating steps in the fabrication of the present invention. FIG. 3 illustrates the semiconductor structure after the substrate has been prepared, STI 25 has been applied to isolate NFET and PFET active areas, gate oxide 64 has been deposited and polysilicon lines 54 have been deposited. In addition, source/drain regions (not shown in FIGS. 3–5 but see 66 and 67 in FIG. 6) and polysilicon lines 54 have been implanted to form P+ diffusions (see 67 in FIG. 6) and N+diffusions (see 66 in FIG. 6). The N+ diffusion is part of at least one NFET (see 66 in FIG. 6) and the P+ diffusion is part of at least one PFET (see 67 in FIG. 6). Also shown in FIG. 3 is the N+/P+ junction area 70.

As may be recognized by those of ordinary skill in the art, the N+/P+ junction 70 may form a semiconductor diode. However, the application of silicide across this N+/P+ junction 70 creates a low-resistance electrical connection. In an SRAM cell 60 as illustrated in FIG. 6, a low-resistance electrical connection may be more desirable than a diode device.

Once these steps are complete, (steps 1–3 of FIG. 2), selective silicidation may occur. As discussed above, a hard mask 80 may be applied to the top surface of the semiconductor structure, but is blocked from the region of the N+/P+ junction 70 (Steps 4 and 5 of FIG. 2). This step is illustrated in FIG. 4.

Finally, as illustrated in FIG. 5, cobalt, titanium or other siliciding metal can be applied to the surface of the semiconductor structure and heat treated (Step 6 of FIG. 2). This heat-treatment creates metal-silicide in areas where the silicided metal was applied to exposed silicon. Therefore, a silicide strap 75 is created in the area of the polysilicon line 54 which was not blocked by the blocking layer 80. In regions protected by the hard mask 80, or by a layer of nitride, oxide, or other blocking material, no silicidation will take place and residual siliciding metal can be selectively removed.

FIG. 6 is a top view of an SRAM cell 60 of the present invention. This SRAM cell 60 is well-known SRAM architecture. While an SRAM cell 60 is illustrated here, those of ordinary skill in the art will recognize that this invention is applicable in any semiconductor structure which utilizes both NFETs and PFETs. The SRAM cell 60 illustrated in FIG. 6 illustrates an embodiment of the silicide strap 75 of the present invention.

FIG. 6 illustrates structures that have been created on the silicon substrate to create the SRAM 60 semiconductor structure. Line 50 in FIG. 6 corresponds to line 50 in FIG. 1, and illustrates the cross section illustrated in FIGS. 3–5. A P+ active area 77 and an N+ active area 76 have been defined by isolating active regions using STI processing. The P+ active area 77 includes two PFETs 67. The N+ active area 76 includes four NFETs 66. Long polysilicon lines 54 have been deposited to create gate structure for both PFETs 67 and NFETs 66. Long polysilicon lines 54 have been formed intersecting the P+ active area 77, forming PFETs 67, and the N+ active area, forming two of the NFETs 66. Long polysilicon lines 54 also intersect the P+ diffusions 67 to the N+ diffusions 66. The N+ active area 76 and the P+ active area 77 are doped. Because this doping step occurs after the polysilicon line 54 has been applied, the polysilicon line 54 is also doped N+ in the N+ area 71 where it overlaps the N+ diffusion 76 and P+ in the P+ area 72 where it overlaps the P+ diffusion 77. This doping will create an N+/P+ junction 70, an area of the polysilicon line where the N+ doped region 71 interacts with the P+ doped region 72, or where the N+ doped region 71 of the polysilicon line abuts the P+ doped region 72 of the polysilicon line.

Blocking, as discussed in FIGS. 2–5, can be applied as indicated by regions 82 and 83. As discussed and illustrated in FIGS. 2 and 4, blocking material such as nitride can be applied to block the formation of silicide on these regions. As FIG. 6 illustrates, silicidation can be selectively applied to the region that has not been protected by the application of the blocking agent. Silicide can be selectively applied to the regions outside the blocked regions represented by 82 and 83. Because only the polysilicon lines 54 are exposed silicon, in the region outside block boxes 82 and 83 (the surrounding regions may be isolation material or STI), only the polysilicon lines 54 that are not in the blocked regions 82 and 83 become silicided upon the application of a siliciding metal and heat treatment. In this manner, the silicide strap 75 is achieved only in the region of the polysilicon lines 54 which is not protected by a blocking agent. The silicide strap 75 is the low resistance connection along the polysilicon line 54 at the N+/P+ junction 70 created by selective silicidation. In addition, because these regions are blocked (see 82 and 83), this selective silicidation does not create a layer of silicide across the PFETs 67 and NFETs 66, which, if present, could lead to the types of current leakage as shown in FIG. 1.

When a device, such as the SRAM structure of FIG. 6, has been selectively silicided according to an embodiment of the present invention, silicide only resides on a silicide strap 75 which creates a low resistance connection at the N+/P+ junction 70. This low resistance connection enhances the performance of the semiconductor device. In addition, according to an embodiment of the present invention, silicide does not reside over the active areas 76 and 77 including the source/drain regions of semiconductor devices.

Because silicide is not present except at the N+/P+ junction 70, leakages such as those illustrated in FIG. 1 are reduced. Because there is no silicide present on the spacers 24 along the sides of the gate 21, there is no "over the spacer leakage" between the gate and the source/drain caused by silicide formation (See FIG. 1). Silicide-mediated GIDL will also be absent in devices that are not silicided. Silicide cannot spike over the source/drain region to create current leakage from the source/drain region into the substrate because no suicide is present over the source/drain region. And, no suicide is present at the edge of the STI, so no silicide pooling or suicide "pull-down" can occur, causing current leakage. These and other reductions in current leakage may lead to greater efficiency and less power usage in the semiconductor device. Therefore, selectively silicided semiconductor structures, such as the SRAM cell described in FIG. 6, may use less power than semiconductor structures which do not make use of an embodiment of the present invention.

While the invention has been particularly shown and described with reference to embodiments thereof, it will be understood by those skilled in the art that various changes in form and details may be made therein without departing from the spirit and scope of the invention.

What is claimed is:

1. A semiconductor structure comprising:
    an N+ diffusion and a P+ diffusion;
    a polysilicon line intersecting the N+ diffusion and the P+ diffusion;
    wherein the polysilicon line has a P+ region, an N+ region and an N+/P+ junction area, said junction area comprising the area where the P+ region of the polysilicon line and the N+ region of the polysilicon line abut each other;
    a silicide strap over a portion of a top surface of the N+ region and the P+ region and extending across the N+/P+ junction area of the polysilicon line, wherein the silicide strap forms an electrical connection between the P+ region of the polysilicon line and the N+ region of the polysilicon line, and wherein the portion of the top surface does not comprise an entire top surface of the N+ region and the P+ region; and
    wherein the N+ diffusion or the P+ diffusion are not silicided.

2. The semiconductor structure of claim 1, wherein the N+ diffusion is part of at least one NFET and wherein the P+ diffusion is part of at least one PFET.

3. The semiconductor structure of claim 1, wherein the semiconductor structure is part of an SRAM cell.

4. The semiconductor structure of claim 1, wherein the polysilicon line comprises at least one gate.

5. The semiconductor structure of claim 1 wherein current leakage in the semiconductor structure is reduced by preventing suicide formation on the N+ diffusion and the P+ diffusion.

6. The semiconductor structure of claim 5 wherein the current leakage reduced comprises Gate Induced Drain Leakage (GIDL).

7. A semiconductor device comprising:
    a first PFET, the first PFET including a source diffusion and a drain diffusion;
    a first NFET, the first NFET including a source diffusion and a drain diffusion;
    a first polysilicon line connecting the first NFET to the first PFET, the first polysilicon line including a N+ portion, a P+ portion and a N+/P+ junction area; and
    a silicide strap over a section of a top surface of the N+ portion and the P+ portion and extending across the N+/P+ junction area of the first polysilicon line wherein the suicide strap forms an electrical connection between the P+ portion and the N+ portion of the first polysilicon line, wherein the section of the top surface does not comprise an entire top surface of the N+ portion and the P+ portion, and wherein the silicide strap is not formed on the PFET source diffusion and PFET drain diffusion and wherein the silicide strap is not formed on the NFET source diffusion and NFET drain diffusion.

8. The semiconductor device of claim 7 further comprising:
 a second PFET, the second PFET including a source diffusion and a drain diffusion;
 a second NFET, the second NFET including a source diffusion and a drain diffusion;
 a second polysilicon line connecting the second NFET to the second PFET, the second polysilicon line including a N+ portion, a P+ portion and a N+/P+ junction area; and
 a second silicide strap extending across the N+/P+ junction area of the second polysilicon line wherein the silicide strap forms an electrical connection between the P+ portion and the N+ portion of the second polysilicon line, and wherein the second silicide strap is not formed on the PFET source diffusion and PFET drain diffusion and wherein the second silicide strap is not formed on the NFET source diffusion and NFET drain diffusion.

9. The semiconductor device of claim 7 wherein the first PFET and the first NFET are portions of an SRAM device.

10. The semiconductor device of claim 7, wherein the first polysilicon line comprises a gate of the first PFET and the first NFET.

11. The semiconductor device claim 8, wherein the second PFET and the second NFET are portions of an SRAM device.

12. The semiconductor device of claim 8, wherein the second polysilicon line comprises a gate of the second PFET and the second NFET.

13. The semiconductor structure of claim 7 wherein current leakage is reduced by preventing silicide formation on the PFET source diffusion and PFET drain diffusion and the NFET source diffusion and NFET drain diffusion.

14. The semiconductor structure of claim 13 wherein the current leakage reduced comprises Gate Induced Drain Leakage (GIDL).

15. The semiconductor structure of claim 8 wherein current leakage is reduced by preventing silicide formation on the PFET source diffusion and PFET drain diffusion and the NFET source diffusion and NFET drain diffusion.

16. The semiconductor structure of claim 15 wherein the current leakage reduced comprises Gate Induced Drain Leakage (GIDL).

\* \* \* \* \*